(12) United States Patent
Heinrich et al.

(10) Patent No.: US 8,536,052 B2
(45) Date of Patent: Sep. 17, 2013

(54) SEMICONDUCTOR DEVICE COMPRISING CONTACT ELEMENTS WITH SILICIDED SIDEWALL REGIONS

(75) Inventors: Jens Heinrich, Wachau (DE); Kai Frohberg, Niederau (DE); Katrin Reiche, Goltzscha (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 95 days.

(21) Appl. No.: 13/208,835

(22) Filed: Aug. 12, 2011

(65) Prior Publication Data
US 2012/0161324 A1 Jun. 28, 2012

(30) Foreign Application Priority Data
Dec. 28, 2010 (DE) .......................... 10 2010 064 288

(51) Int. Cl.
*H01L 21/44* (2006.01)

(52) U.S. Cl.
USPC .................... 438/655; 257/E21.328; 438/682

(58) Field of Classification Search
USPC .......... 257/751, 757, 758, 763, 764, E21.328, 257/E23.017; 438/648, 649, 651, 653, 656, 438/660, 663, 672
See application file for complete search history.

(56) References Cited

U.S. PATENT DOCUMENTS

| | | | |
|---|---|---|---|
| 5,504,038 A * | 4/1996 | Chien et al. | 438/647 |
| 5,825,059 A | 10/1998 | Kuroda | |
| 5,899,741 A | 5/1999 | Tseng et al. | |
| 6,136,697 A * | 10/2000 | Wu | 438/648 |
| 6,194,315 B1 | 2/2001 | Hu et al. | |
| 6,376,368 B1 * | 4/2002 | Jung et al. | 438/639 |
| 7,557,446 B2 * | 7/2009 | Ito et al. | 257/751 |
| 2008/0245414 A1 * | 10/2008 | Sheng et al. | 136/261 |

FOREIGN PATENT DOCUMENTS
JP 2006108452 A 4/2006

OTHER PUBLICATIONS

Translation of Official Communication from German Patent Application No. 10 2010 064 288.6 dated Jul. 15, 2011.

* cited by examiner

*Primary Examiner* — Matthew W Such
*Assistant Examiner* — Warren H Kilpatrick
(74) *Attorney, Agent, or Firm* — Williams, Morgan & Amerson, P.C.

(57) ABSTRACT

When forming a metal silicide within contact openings in complex semiconductor devices, a silicidation of sidewall surface areas of the contact openings may be initiated by forming a silicon layer therein, thereby reducing unwanted diffusion of the refractory metal species into the laterally adjacent dielectric material. In this manner, superior reliability and electrical performance of the resulting contact elements may be achieved on the basis of a late silicide process.

15 Claims, 6 Drawing Sheets

SEMICONDUCTOR DEVICE COMPRISING CONTACT ELEMENTS WITH SILICIDED SIDEWALL REGIONS

BACKGROUND OF THE INVENTION

1. Field of the Invention

The present disclosure generally relates to the fabrication of integrated circuits, and, more particularly, to the fabrication of highly sophisticated circuit elements, such as MOS transistor structures, requiring contact areas to be formed after providing the interlayer dielectric material of a contact level.

2. Description of the Related Art

The manufacturing process for integrated circuits continues to improve in several ways, driven by the ongoing efforts to scale down the feature sizes of the individual circuit elements. Presently and in the foreseeable future, the majority of integrated circuits are and will be based on silicon devices due to the superior availability of silicon substrates and due to the well-established process technology that has been developed over the past decades. A key issue in developing integrated circuits of increased packing density and enhanced performance is the scaling of transistor elements, such as MOS transistor elements, to provide the immense number of transistor elements that may be necessary for producing complex integrated circuits, such as CPUs, memory devices, mixed signal devices and the like. One important aspect in manufacturing field effect transistors having reduced dimensions is the reduction of the length of the gate electrode that controls the current flow in a conductive channel positioned between the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length results in smaller and faster transistor elements, it turns out, however, that a plurality of issues are additionally involved to maintain proper transistor performance for a reduced gate length. One challenging task in this respect is the provision of shallow junction regions, i.e., source and drain extension regions and drain and source regions connecting thereto, which nevertheless exhibit a high conductivity so as to minimize the resistivity in conducting charge carriers from the source via the channel and to the drain region.

By providing sophisticated dopant profiles in the drain and source regions in combination with a reduced channel length, therefore, in total, a reduced series resistance of the transistors may be achieved. In sophisticated applications, however, the total resistance of transistors may no longer be determined by the drain and source regions and the channel region, but rather a contact resistivity may increasingly become a dominant factor, since with the reduction in size of the transistor elements, corresponding contact elements, which are to be understood as also containing elements extending through a dielectric material of a contact level of the semiconductor device, also may have to be accordingly adapted. In particular, the contact resistivity, i.e., the resistance of the transition area from the contact element to the highly doped drain and source areas, is typically reduced by forming a metal/silicon compound in the highly doped drain and source regions, which typically provides a lower resistance compared to even very strongly doped silicon material. To this end, appropriate silicidation processes have been developed, in which a refractory metal, such as cobalt, titanium and the like, is deposited and subsequently exposed to appropriate elevated temperatures in the range of 350-600° C. in order to initiate a chemical reaction between the silicon material and the refractory metal. The resulting resistance value of the silicon/metal compound strongly depends on the metal species and the process conditions. In recent developments, nickel is used as a preferred candidate for a metal silicide material due to its reduced resistivity compared to, for instance, cobalt silicide and the like. When forming a nickel silicide in the highly doped silicon regions, a nickel layer is typically formed, for instance, by sputter deposition, and subsequently a heat treatment on the basis of temperatures in the range of approximately 400° C. is applied, wherein an exposure to elevated temperatures in the further processing may be suppressed, since, in this case, the nickel silicide previously thermally stabilized on the basis of temperatures as specified above may otherwise exhibit reduced stability and/or increased resistivity.

In a typical process flow, the basic transistor configuration is completed after performing any high temperature processes and, thereafter, the nickel silicide may be formed on the basis of a process strategy as set forth above, wherein any non-reacted nickel material on dielectric surface areas may be efficiently removed on the basis of wet chemical selective etch recipes. Thereafter, the interlayer dielectric material system of the contact level is provided, for instance, by plasma enhanced chemical vapor deposition (CVD) techniques, in which typically process temperatures may be adjusted to a level that does not unduly affect the previously formed metal silicide. Thereafter, contact openings are formed in the interlayer dielectric material and are subsequently filled with an appropriate contact material, such as tungsten, which is typically provided, in combination with appropriate barrier materials, such as titanium, titanium nitride, on the basis of a thermally activated CVD process, wherein also in this case the applied process temperatures are compatible with the previously formed nickel silicide material.

Recently, sophisticated process strategies have been developed in which elevated temperatures may have to be applied in a very late manufacturing stage, i.e., after forming at least a part of the contact level, wherein these temperatures may not be compatible with the metal silicide formed in the doped semiconductor areas. For example, in sophisticated semiconductor devices, high-k metal gate electrode structures are frequently provided in order to overcome the limitations imposed by conventional silicon/polysilicon based gate electrode structures. To this end, a high-k dielectric material, such as hafnium oxide, hafnium silicon oxide, zirconium oxide and the like, may be provided as a gate dielectric material, possibly in combination with a very thin conventional silicon oxide based material, in order to reduce the gate leakage currents for a required capacitive coupling between the gate electrode and the channel region. Moreover, metal containing electrode materials may be provided in combination with the high-k dielectric material in order to endow these sophisticated gate electrode structures with superior conductivity and adjust an appropriate work function. Since generally fabrication of sophisticated high-k metal gate electrode structures requires a plurality of very complex process strategies, in some approaches, critical process steps, such as the incorporation of superior electrode materials, may be performed in a very late manufacturing stage, while the actual patterning and, thus, adjusting of the critical dimensions of the gate electrode structures may be accomplished on the basis of well-established gate materials, such as silicon dioxide and polysilicon. After completing the basic transistor configuration in these approaches, the interlayer dielectric material or at least a portion thereof is typically provided and the polysilicon of the gate electrode structures is then exposed on the basis of a removal process in order to enable the removal of the polysilicon material and the replacing thereof with appropriate metal-containing electrode materials. In some of these so-called replacement gate approaches, the incorporation of appropriate metal-containing materials may be associated with high temperature processes, for instance for appropriately incorporating work function metal species and the like, wherein the applied process temperatures may frequently not be compatible with the formation of a nickel silicide in an early manufacturing stage.

In particular due to restrictions imposed on the thermal budget of the silicidation process, process strategies have been developed in which the contact resistivity may be reduced in a later manufacturing stage, wherein a nickel silicide may be formed locally within the contact openings by forming a nickel layer in the contact opening and initiating the silicidation in accordance with well-established nickel silicide process recipes, followed by the removal of any excess metal. Thereafter, the contact metal may be formed by well-established process strategies, as discussed above.

This approach, which may also be referred to as a "late silicide process," may provide superior process conditions, for instance in terms of any thermal budget of preceding manufacturing steps, however, the conventional process strategy described above may be associated with reduced reliability and electrical performance of the resulting contact level, as will be described in more detail with reference to FIGS. 1a-1d.

Figure 1A:
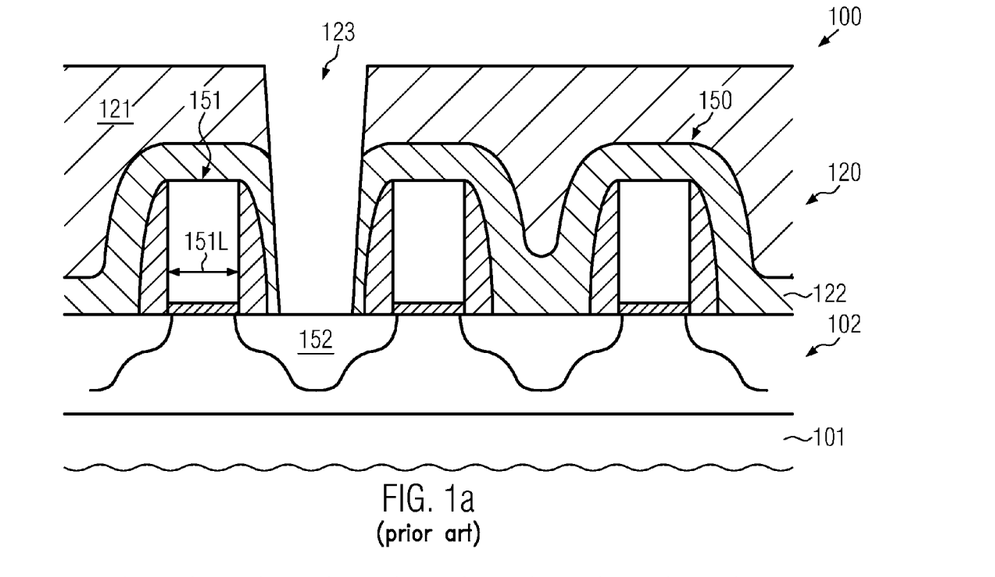
FIGS. 1a-1d schematically illustrate cross-sectional views of a semiconductor device during various manufacturing stages in forming a late metal silicide on the basis of conventional process strategies.

FIG. 1a schematically illustrates a cross-sectional view of a semiconductor device 100 comprising a substrate 101 and a semiconductor layer 102. The substrate 101 may typically be provided in the form of a silicon material or any other semiconductor material or insulating material, which is appropriate for forming thereon the semiconductor layer 102, typically a silicon-containing semiconductor material. Furthermore, a buried insulating material (not shown) may be provided below the semiconductor layer 102 if a silicon-on-insulator (SOI) architecture is considered. The device 100 is illustrated in an advanced manufacturing stage, i.e., in a manufacturing stage in which circuit elements 150 are formed in and above the semiconductor layer 102. As discussed above, in sophisticated applications, the circuit elements 150 may comprise transistors formed on the basis of critical dimensions of 50 nm and significantly less, for instance in sophisticated CMOS technologies. For example, the circuit elements 150 may be provided in the form of field effect transistors having components, such as gate electrode structures 151, with a lateral dimension 151L in the above-specified range. It should be appreciated that the circuit elements 150 including the components 151, such as gate electrode structures, may have any appropriate configuration in accordance with the corresponding design rules of the device 100. Furthermore, the semiconductor layer 102 in combination with the circuit elements 150 comprises highly doped regions 152, such as drain and source regions in the case of field effect transistors. In complex integrated circuits, device areas with closely spaced circuit elements, such as transistors in static RAM areas in complex CMOS devices and the like, may have to be implemented, thereby also requiring appropriate adapted contact elements in a contact level 120, which acts as an interface for connecting the circuit elements 150 with a complex metallization system (not shown) to be formed above the contact level. In the example shown, the contact level 120 may comprise an interlayer dielectric material 121, typically provided in the form of silicon dioxide, possibly in combination with an etch stop material 122, such as a silicon nitride material. Moreover, a contact opening 123 is formed in the dielectric materials 121, 122 so as to expose a portion of the highly doped region 152 in which, according to the "late" silicide process strategy, a metal silicide is to be formed within the contact opening 123 in order to reduce the overall resistivity of the circuit elements 150 when contacting the region 152. In some conventional approaches, the contact openings 123 are typically provided in the form of trenches that extend along a width direction, i.e., in FIG. 1a, a direction perpendicular to the drawing plane.

The semiconductor device 100 as shown in FIG. 1a may be formed on the basis of the following conventional process techniques. The circuit elements 150 may be formed in appropriately defined semiconductor regions or active regions of the semiconductor layer 102, wherein a lateral delineation of any such semiconductor regions may be accomplished by providing appropriate isolation regions or structures (not shown). Thereafter, the circuit elements 150 may be formed, for instance, by incorporating an appropriate basic dopant species into the semiconductor layer 102, i.e., in the various active regions thereof, and forming appropriate materials and material systems in order to form the features 151, for instance in the form of gate electrode structures and the like. As discussed above, in sophisticated applications, very complex lithography and etch techniques may have to be applied so as to form the gate electrode structures in accordance with the overall requirements. Moreover, the highly doped regions 152 may be implemented at any appropriate manufacturing stage, for instance after forming the gate electrode structures 151, so as to obtain the highly doped regions 152 in a self-aligned manner. Thereafter, any high temperature processes may be performed in order to activate the dopant species, re-crystallize implantation-induced damage and the like. Next, a dielectric material of the contact level 120 may be formed, possibly in combination with sophisticated replacement gate approaches, as discussed above, wherein additional heat treatments may have to be carried out, as required for adjusting the overall transistor characteristics. In the example shown, the contact level may be formed by depositing the material 122, followed by the material 121, which is accomplished by applying well-established deposition recipes. Thereafter, the surface topography is planarized and complex lithography techniques are applied in order to pattern the material system of the level 120 in order to form the contact opening 123 with lateral dimensions corresponding to lateral dimensions of the circuit element 150.

Figure 1B:
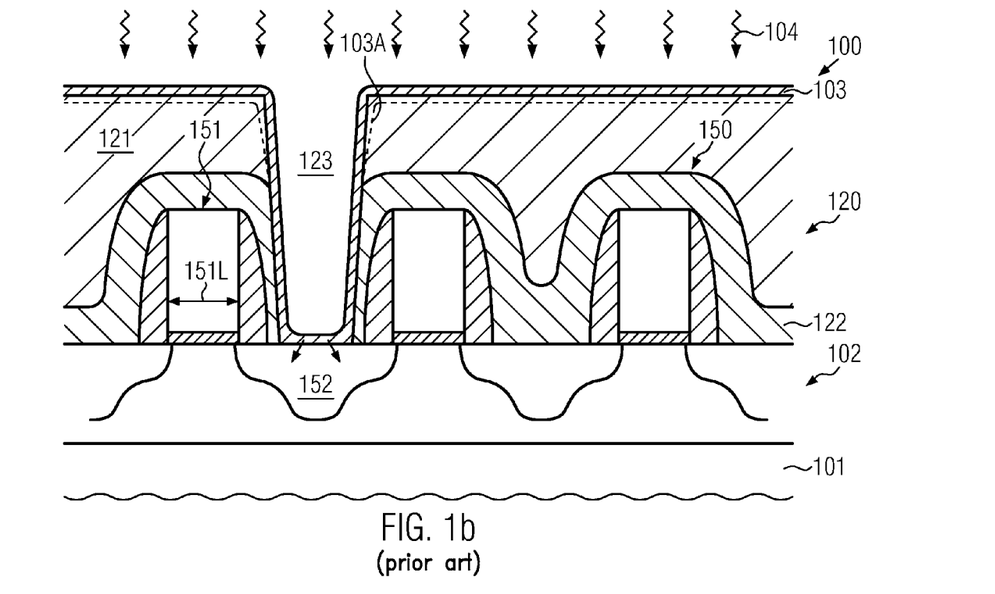

FIG. 1b schematically illustrates the device 100 in a further advanced manufacturing stage. As illustrated, a layer of refractory metal 103, such as a nickel layer in sophisticated applications, is formed on any exposed surface areas of the dielectric materials 121, 122 and thus within the contact opening 123. To this end, sputter deposition techniques may typically be applied, wherein, prior to the deposition of the material 103, typically sophisticated cleaning recipes are performed in order to appropriately prepare the exposed portion of the doped semiconductor region 152 for the subsequent silicidation process. Thereafter, a heat treatment 104 or a sequence of heat treatments may be performed, depending on the characteristics of the metal species in the layer 103, thereby initiating a diffusion of the metal species into the exposed semiconductor region 152, thereby increasingly forming a metal silicide therein. During the process 104, however, also a certain degree of diffusion may occur into the dielectric material 121, such as a TEOS-based silicon dioxide material, as indicated by 103A. In particular, in densely packed device regions requiring extremely scaled lateral dimensions of the contact elements, the presence of the metal species 103A in the dielectric material 121 may result in inferior reliability of the contact level and also electrical performance, such as parasitic capacitance and the like, may deteriorate.

Figure 1C:
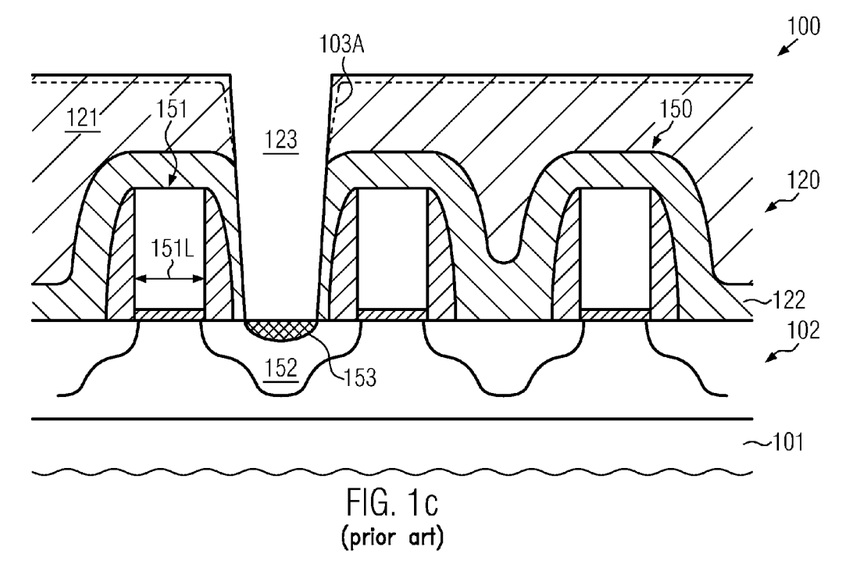

FIG. 1c schematically illustrates the device 100 in a further advanced manufacturing stage in which a metal silicide 153 is formed in the doped region 152, thereby reducing its contact resistivity for connecting to a contact element that is still to be formed in the contact opening 123. Furthermore, in this manufacturing stage, any non-reacted metal material is removed, which is typically accomplished on the basis of selective wet chemical etch recipes and the like. Thus, at surface areas of the dielectric material 121, the previously incorporated metal species 103A may still be present.

Figure 1D:
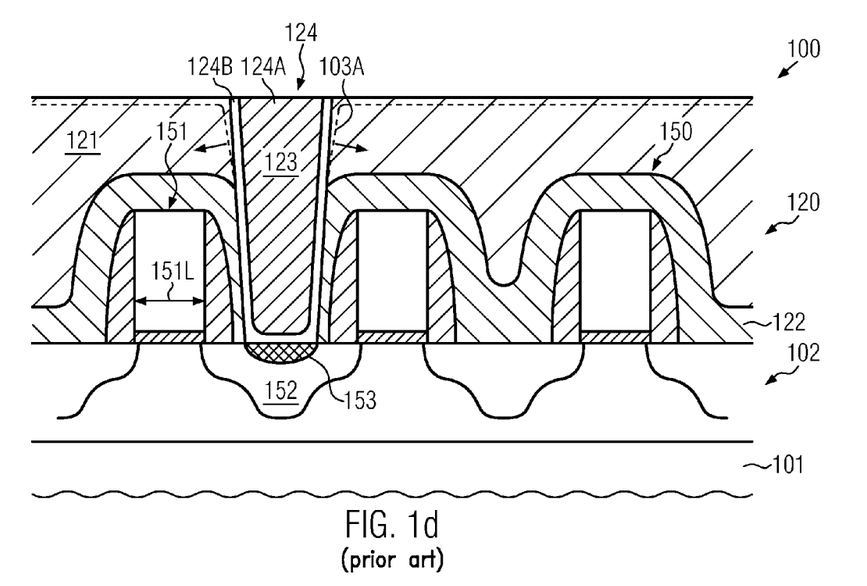

FIG. 1d schematically illustrates the semiconductor device 100 in a further advanced manufacturing stage. As illustrated, a contact element 124 is formed in the contact opening 123 and thus connects to the metal silicide region 153. The contact element 124 is typically comprised of a highly conductive metal, which at the same time is compatible with the overall device requirements and the further processing of the device 100. For example, in sophisticated applications, frequently a tungsten core metal 124A is provided in the contact openings 124 in combination with an appropriate barrier material or material system 124B, for instance provided in the form of titanium and titanium nitride and the like. The contact element 124 is typically formed by using appropriate deposition techniques, such as sputter deposition, for forming the one or more barrier layers 124B, followed by a sophisticated CVD process for depositing the tungsten material, wherein usually the barrier material system 124B may avoid undue exposure of any silicon dioxide materials to the CVD atmosphere for forming the tungsten material, which would otherwise result in a deterioration of the interface characteristics for many well-established tungsten deposition recipes. Thereafter, any excess material is removed, for instance by chemical mechanical polishing (CMP), thereby also removing the barrier material from above the dielectric material 121 of the contact level 120. Consequently, the contact element 124 is provided as an electrically isolated element.

As discussed above, upon further device scaling, the lateral dimension of the contact elements 124, at least in the horizontal direction in FIG. 1d, also has to be adapted to the reduced feature sizes of the circuit elements 150, thereby increasing the resistivity of the contact elements 124 for a given material system, in particular as the barrier material system 124B may not be arbitrarily reduced in thickness without jeopardizing the reliability of the contact elements 124. Moreover, as discussed above with reference to FIGS. 1b and 1c, the previously incorporated metal species 103A may also contribute to a reduced reliability and electrical performance of the contact elements 124, in particular in highly scaled semiconductor devices. In order to avoid the incorporation of the metal species 103A, it has, therefore, been suggested to form a diffusion blocking material, such as a silicon nitride liner, within the contact opening 123 prior to depositing the refractory metal species. Although this approach may significantly reduce any contact irregularities caused by the species 103A, on the other hand, the overall contact resistivity may increase since, for given lateral dimensions of the contact element 124, additional liner materials may result in a reduced volume that is available for the actual contact materials.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques and semiconductor devices in which a metal/semiconductor compound, such as a metal silicide, may be formed in a manufacturing stage after providing at least a portion of the dielectric material of the contact level, while at the same time, however, avoiding, or at least significantly reducing, the incorporation of the refractory metal species into the surrounding dielectric material without reducing the effective lateral dimensions of the contact opening. To this end, at least the sidewalls of the contact openings may be passivated by forming metal/semiconductor compounds, such as a metal silicide, on inner surface areas of the contact openings by providing an appropriate semiconductor material in the contact opening, thereby reducing the incorporation of a metal species into the adjacent dielectric material. Consequently, after performing a heat treatment, a highly conductive sidewall coverage may be obtained in the contact openings, while at the same time unwanted diffusion of the metal species into the dielectric material may be suppressed, since metal species preferably diffuse into the semiconductor material and form a compound therein.

In some illustrative aspects disclosed herein, the provision of metal/semiconductor compound sidewall spacer elements in the contact openings may be combined with process strategies for further enhancing the overall performance of the contact elements, for instance by avoiding the formation of a barrier material system, which may have typically a reduced conductivity compared to a metal silicide, such as a nickel silicide.

One illustrative method disclosed herein comprises forming a contact opening in a dielectric material of a contact level of a semiconductor device, wherein the contact opening connects to a doped semiconductor region. The method further comprises forming a semiconductor layer on inner surface areas of the contact opening and forming a refractory metal layer on the semiconductor layer. Furthermore, the method comprises performing a heat treatment so as to form a metal silicide from the semiconductor layer on the inner surface areas of the contact opening and in the doped semiconductor region.

A further illustrative method disclosed herein comprises forming a contact opening in a dielectric material of a semiconductor device, wherein the contact opening exposes a portion of a doped semiconductor region. Additionally, the method comprises forming a silicon layer above the dielectric material and in the contact opening and forming a metal layer on the silicon layer. Furthermore, the method comprises performing a heat treatment so as to initiate formation of a metal silicon compound.

One illustrative semiconductor device disclosed herein comprises a doped semiconductor region formed in a semiconductor layer of the semiconductor device. The semiconductor device further comprises a contact region formed in the doped semiconductor region and comprised of a first metal/semiconductor compound. Moreover, a contact level is formed above the semiconductor layer and a contact element is formed in a dielectric material of the contact level and connects to the contact region. The contact element comprises a core contact material and a second metal/semiconductor compound that is formed adjacent to the dielectric material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure basically contemplates semiconductor devices and manufacturing techniques in which a metal/semiconductor compound, such as a metal silicide, may be formed locally in a highly doped semiconductor region, a portion of which may be exposed by forming a contact opening in the dielectric material of a contact level. In order to avoid undue diffusion of the refractory metal species into the surrounding dielectric material, a semiconductor layer, such as a silicon layer, is formed at least on inner sidewall surface areas of the contact openings prior to depositing the refractory metal layer. Consequently, during the subsequent heat treatment for initiating inter-diffusion of the metal and semiconductor species and, thus, upon forming the metal/semiconductor compound, the metal species is preferably consumed in the semiconductor material, thereby significantly reducing or essentially completely avoiding the diffusion into the adjacent dielectric material. Consequently, highly conductive sidewall spacers may be provided in the contact opening, which may result, in combination with the actual contact material or material system, in superior conductivity, while at the same time avoiding any degradation in reliability and electrical performance due to unwanted metal species diffused into the surrounding dielectric material.

In some illustrative embodiments, the metal silicide or the refractory metal may be used as efficient barrier materials during the formation of the actual contact material, such as a tungsten material, thereby enabling omitting conventional barrier material systems, which may thus also result in superior electrical performance.

With reference to FIGS. 2a-2h, further illustrative embodiments will now be described in more detail, wherein reference may also be made to FIGS. 1a-1d, if required.

Figure 2A:
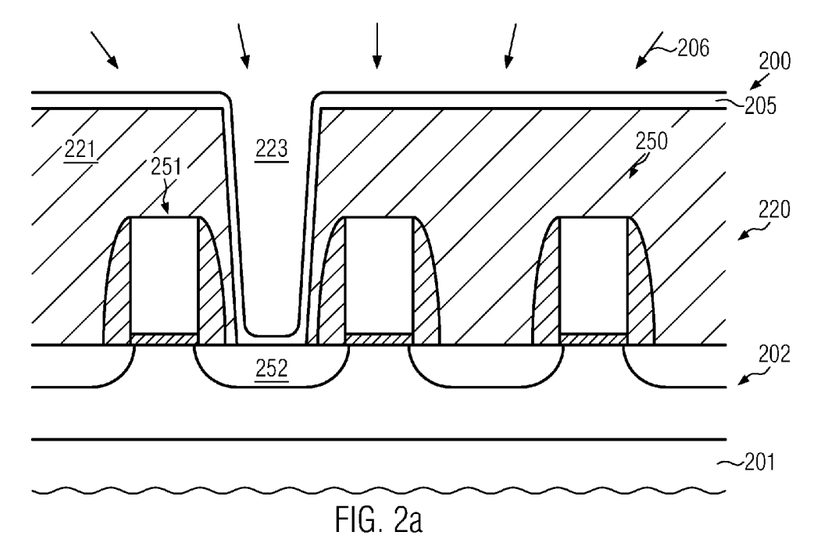
FIGS. 2a-2e schematically illustrate cross-sectional views of a semiconductor device during various manufacturing stages in which a metal/semiconductor compound, such as a metal silicide, is formed on sidewalls of a contact opening prior to incorporating the actual contact material, according to illustrative embodiments.

FIG. 2a schematically illustrates a cross-sectional view of a semiconductor device 200 comprising a substrate 201 and a semiconductor layer 202. Furthermore, circuit elements 250, such as field effect transistors and the like, may be formed in and above the semiconductor layer 202, wherein, in sophisticated applications, feature sizes or critical dimensions may have to be provided with 50 nm and less, depending on the overall device requirements. For example, the circuit elements 250 may comprise line-like structures, such as gate electrode structures and the like, indicated by 251, which may have at least one lateral dimension in the above-specified range. It should be appreciated, however, that although the principles disclosed herein are highly advantageous in the context of sophisticated semiconductor devices formed on the basis of lateral dimensions as discussed above, nevertheless, the principles disclosed herein may also be applied to less critical semiconductor devices, thereby also improving overall reliability and performance.

The device 200 may comprise a highly doped region 252, such as drain and source regions of field effect transistors and the like, which have to be contacted by appropriate contact elements to be formed in a contact level 220 of the device 200. For example, as shown, the contact level 220 may comprise one or more dielectric materials, wherein, for convenience, the dielectric material 221 is illustrated in FIG. 2a. It should be appreciated, however, that two or more dielectric materials may be provided in the contact level 220, depending on the overall process and device requirements. Furthermore, a contact opening 223 is formed in the dielectric material 221 so as to connect to a portion of the highly doped region 252, at least in an initial state prior to depositing a semiconductor layer 205 above the dielectric material 221 and within the contact opening 223.

It should be appreciated that, with respect to the substrate 201, the semiconductor layer 202, the circuit elements 250 and the contact level 220, the same criteria may apply as previously discussed with reference to the semiconductor device 100. It should be appreciated, however, that, contrary to the conventional approaches, the layer or liner 205 may be formed on the basis of a material which may be efficiently converted into a highly conductive material, while at the same time suppressing or at least significantly reducing any unwanted diffusion of a metal species into the surrounding dielectric material 221, at least in the vicinity of the contact opening 223.

The semiconductor device 200 may be formed on the basis of any appropriate process strategy, as is also discussed above with reference to the semiconductor device 100. Hence, after forming the contact opening 223 in the contact level 220 on the basis of complex lithography and patterning strategies, and possibly after performing any cleaning processes, the semiconductor layer 205, for instance in the form of a silicon material, may be deposited on the basis of appropriate deposition strategies. For example, in some illustrative embodiments, a deposition process 206 may be performed on the basis of chlorosilane and hydrogen, wherein reduced process temperatures of, for instance, approximately 400° C. and less may be applied so that a negative influence on previously formed materials and components of the device 200 may be avoided. For example, a plasma enhanced CVD process may be applied on the basis of the above-specified gas components.

Figure 2B:
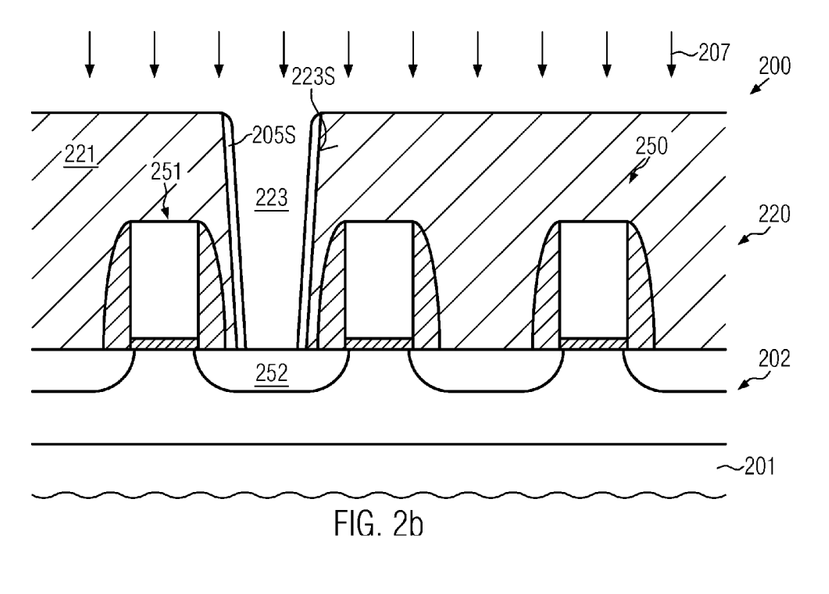

FIG. 2b schematically illustrates the semiconductor device 200 according to illustrative embodiments in which an anisotropic etch process 207 may be performed in order to remove the semiconductor material of the layer 205 (FIG. 2a) from above the dielectric material 221, if the presence of the semiconductor material is considered inappropriate. Moreover, during the process 207, the heavily doped semiconductor region 252 may also be exposed within the contact opening 223, while on the other hand corresponding sidewall spacers 205S may be formed on inner surface areas 223S of the contact opening 223. The etch process 207 may be performed on the basis of any appropriate process recipes as are well established for etching silicon material selectively with respect to silicon dioxide, silicon nitride and the like.

Figure 2C:
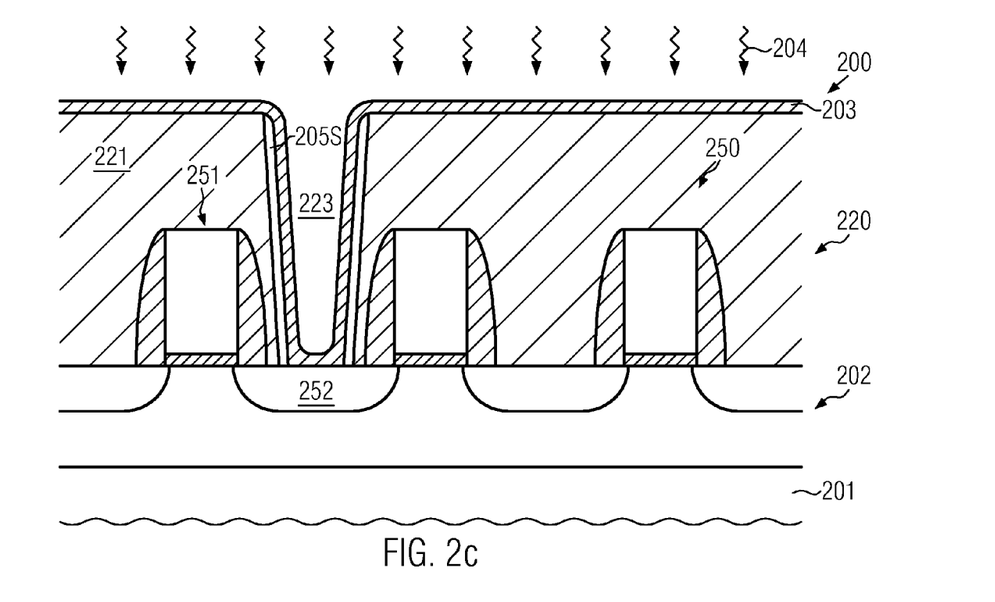

FIG. 2c schematically illustrates the device 200 in a further advanced manufacturing stage in which a layer of a refractory metal species 203 may be formed above the dielectric material 221 and on the semiconductor material 205S within the contact opening 223. For example, the layer 203 may comprise any appropriate metal species, such as nickel, platinum and the like, while in other cases cobalt may be used, depending on the overall requirements with respect to the conductivity of the resulting contact element. The layer 203 may be formed on the basis of well-established deposition techniques, such as sputter deposition and the like. Thereafter, a heat treatment or a sequence of heat treatments 204 may be applied so as to initiate a chemical reaction of the layer 203 with any underlying semiconductor materials, such as the highly doped region 252 and the spacers 205S.

Figure 2D:
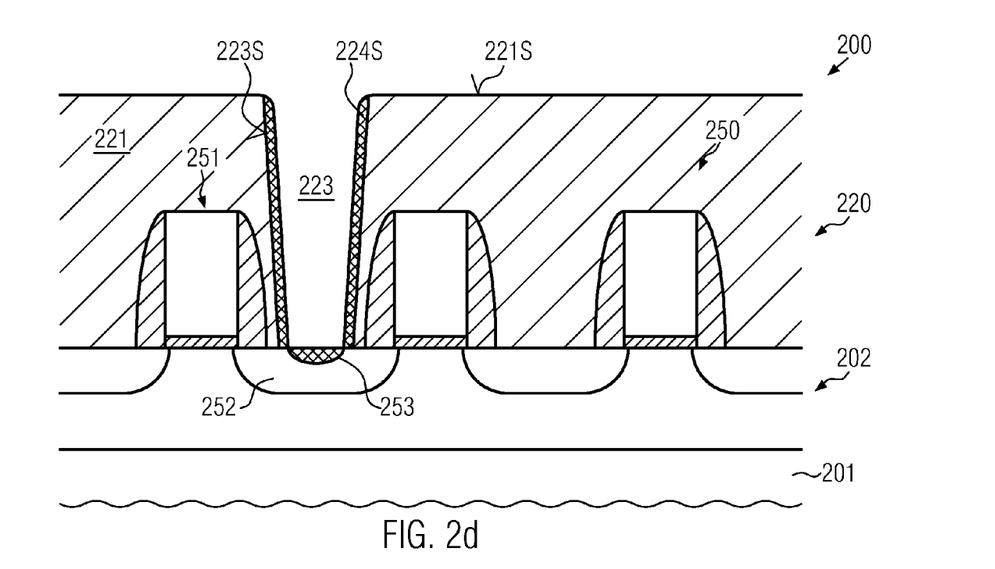

FIG. 2d schematically illustrates the device 200 in a further advanced manufacturing stage in which a metal silicide 224S is formed on sidewalls of the contact opening 223 due to the "silicidation" of the spacer 205S (FIG. 2c). Furthermore, a metal silicide 253 may be formed in the doped region 252, thereby reducing its contact resistivity, as is also previously explained. The device 200 as shown in FIG. 2d may be formed by removing any non-reacted species of the metal layer 203 (FIG. 2c), which may be accomplished by applying selective chemical etch recipes and the like. Thereafter, if required, the silicide 224S and 253 may be thermally stabilized by performing an additional heat treatment. It should be appreciated that, during the preceding silicidation process, a certain degree of metal diffusion into the material 221 may take place at horizontal surface areas 221S, which, however, may not substantially negatively affect the overall device behavior since in particular the surface layer 221S may be removed during the further processing.

Figure 2E:
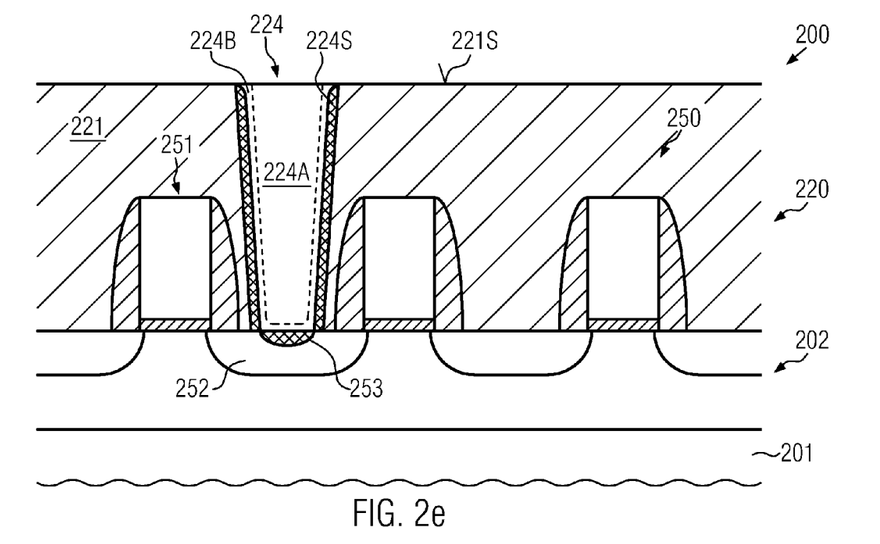

FIG. 2e schematically illustrates the device 200 in a further advanced manufacturing stage. As illustrated, a contact element 224 may be formed in a contact level 220 and may comprise the metal silicide spacers 224S in combination with at least a core metal 224A, such as a tungsten material and the like. Consequently, the contact element 224 may connect to the metal silicide material 253 and finally to the doped semiconductor region 252, while at the same time a negative effect of thoroughly using metal species, as is explained above with reference to the conventional device 100, may be suppressed or substantially completely avoided. Moreover, as shown, in some cases, a barrier material 224B may be formed, for instance in the form of titanium nitride, titanium and the like.

The device 200 as shown in FIG. 2e may be formed by well-established contact regimes, i.e., the barrier material or material system 224B may be deposited, followed by the deposition of the core metal 224A, followed by a removal process, for instance based on CMP, thereby also removing any surface contamination of the dielectric material 221, as discussed above.

Figure 2F:
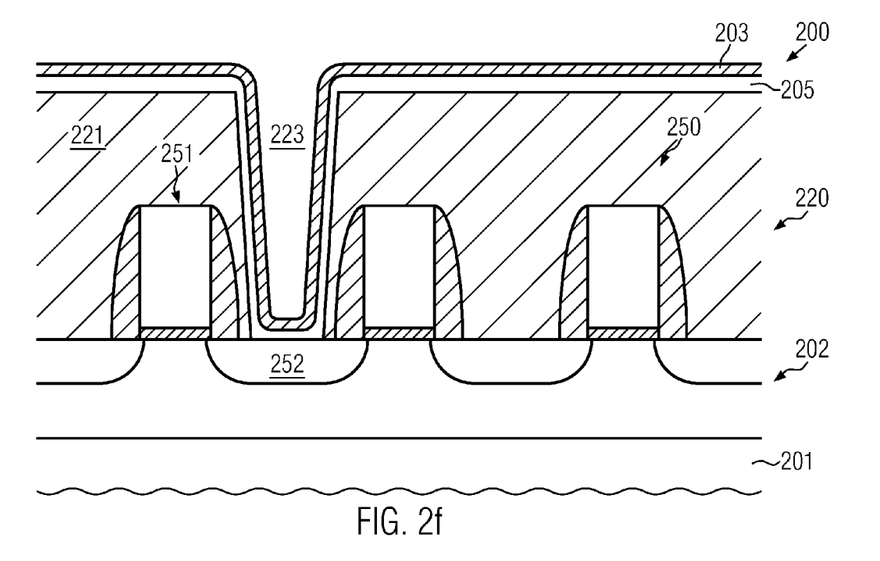
FIGS. 2f-2g schematically illustrate cross-sectional views of the semiconductor device according to still further illustrative embodiments in which a silicide formation may be initiated within the contact opening and also above the dielectric material of the contact level.

FIG. 2f schematically illustrates the semiconductor device 200 according to further illustrative embodiments in which the semiconductor layer 205 may be formed above the dielectric material 221 and within the contact opening 223, as is also previously explained with reference to FIG. 2a. Moreover, the layer 205 may be preserved, at least partially, above the dielectric material 221, which may be accomplished by omitting a corresponding patterning process or performing a corresponding patterning process so as to preserve a portion of the layer 205 while reducing or completely removing the material 205 from above the doped region 252, if an increased amount of semiconductor material in this area is considered inappropriate. In other cases, the refractory metal 203 may be deposited directly on the semiconductor layer 205 without a preceding material removal process. Consequently, upon initiating a silicidation process, metal silicide may be efficiently formed within the contact opening 223 and in and above the doped region 252, as is also previously explained, while also a metal silicide may be formed on the layer 205 above the dielectric material 221.

Figure 2G:
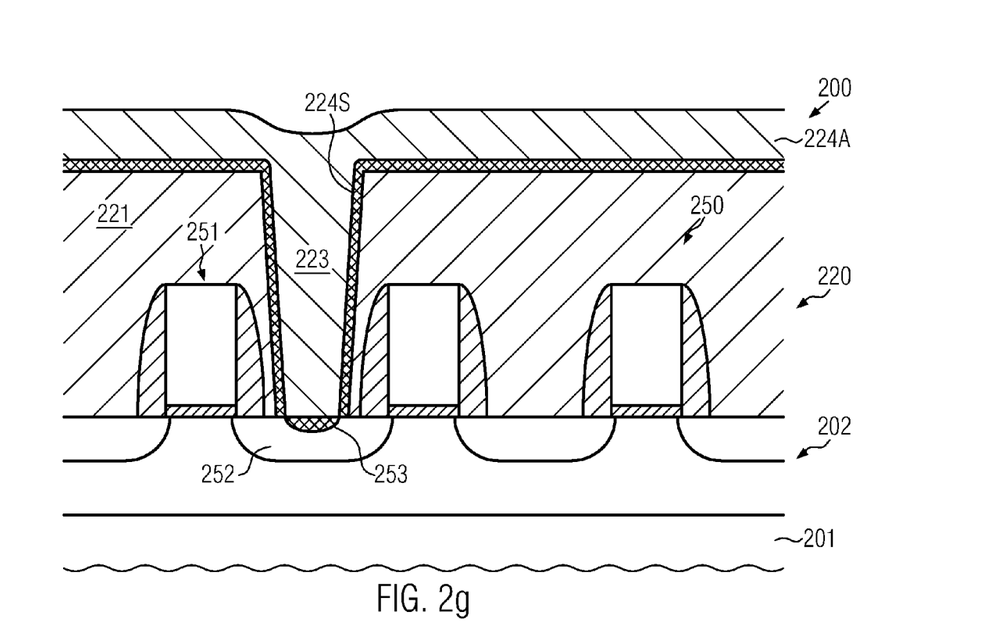

FIG. 2g schematically illustrates the device 200 in a further advanced manufacturing stage in which the metal silicide 224S may thus be formed within the opening 223 and above the dielectric material 221. Furthermore, a core metal 224A, such as tungsten, is formed in the contact opening 223, wherein, in some illustrative embodiments, a preceding deposition of a barrier material may be omitted since the metal silicide 224S may be efficiently used as a barrier material so as to avoid undue exposure of the dielectric material 221 during the deposition of the core metal 224A. Hence, the overall conductivity of the resulting contact element may be increased since the barrier material system may have inferior conductivity compared to the core metal 224A and the metal silicide material 224S. After the deposition of the core material 224A, the further processing may be continued by removing any excess material, thereby also removing the metal silicide material 224S from above the dielectric material 221.

Figure 2H:
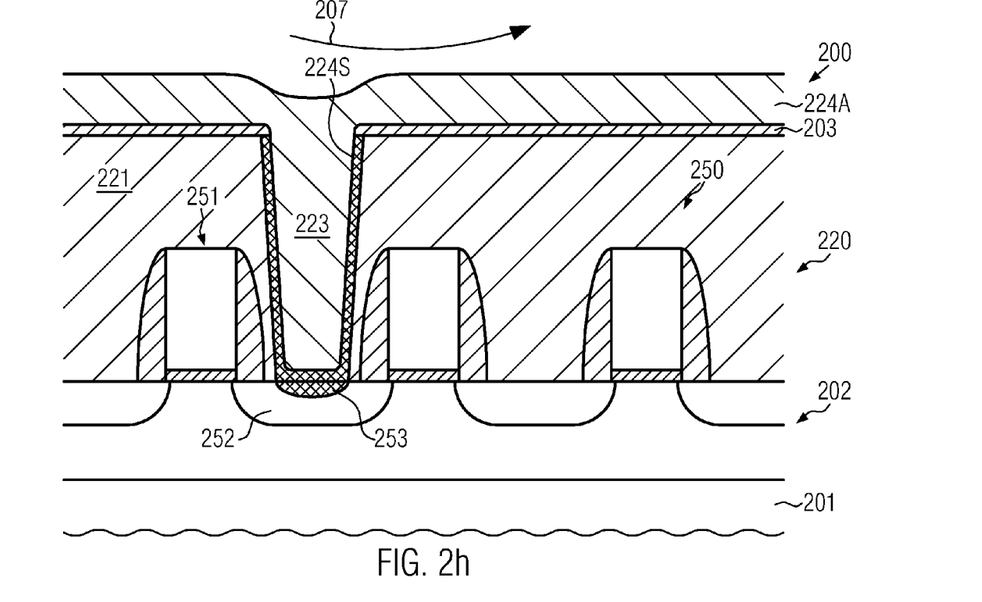
FIG. 2h schematically illustrates a cross-sectional view of the semiconductor device according to illustrative embodiments in which excess material of the refractory metal and of the contact material system may be removed in a common removal process.

FIG. 2h schematically illustrates the semiconductor device 200 according to still further illustrative embodiments. As shown, the metal silicide spacer elements 224S may be provided within the contact opening 223, which may be accomplished by depositing the layer 203 and performing a silicidation process, as described above. In the embodiment shown, however, any non-reacted material of the layer 203 may be preserved and may be used as an efficient barrier material upon depositing the core metal 224A, for instance in the form of a tungsten material. Consequently, also superior electrical performance of the resulting contact element may be obtained due to the omission of the barrier material system of inferior conductivity. Thereafter, a removal process 207, such as a CMP process, may be applied in order to remove any excess material of the core metal 224A and of the layer 203.

In some illustrative embodiments, the metal silicide 224S may be formed in the presence of the core metal 224A, for instance when the corresponding process temperature may be applied upon depositing the core metal 224A and may be sufficiently high so as to initiate a corresponding silicidation process. For example, by providing the refractory metal in the form of a nickel material, the corresponding deposition temperatures during the process 207 may initiate sufficient nickel diffusion and thus the metal silicide 224S may be formed without a dedicated heat treatment. Also in this case, the provision of any barrier material or material system may be omitted, thereby also contributing to superior conductivity of the resulting contact element.

As a result, the present disclosure provides semiconductor devices and manufacturing techniques in which contact elements may be formed so as to receive a metal silicide spacer element in order to suppress unwanted metal diffusion into the dielectric material laterally adjacent to the contact openings, which may cause reduced reliability and electrical performance in conventional strategies. To this end, a silicon layer or silicon-containing semiconductor layer may be formed, at least on inner sidewall surface areas of the contact openings, prior to performing the silicidation process. In some illustrative embodiments, a barrier material or material system may be omitted upon forming the actual contact material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a contact opening in a dielectric material of a contact level of a semiconductor device, said contact opening connecting to a doped semiconductor region;
    forming a semiconductor layer on inner surface areas of said contact opening, said semiconductor layer contacting an exposed surface of said doped semiconductor region at a bottom of said contact opening;
    after forming said semiconductor layer, performing a plasma-based etch process so as to remove at least a portion of said semiconductor layer and thereby re-expose said surface of said doped semiconductor region at said bottom of said contact opening;
    forming a refractory metal layer on said semiconductor layer and said re-exposed surface of said doped semiconductor region; and
    performing a heat treatment so as to form a metal silicide from said semiconductor layer on said inner surface areas of said contact opening and in said doped semiconductor region.

2. The method of claim 1, further comprising removing a non-reacted portion of said refractory metal layer and forming a conductive contact material in said contact opening.

3. The method of claim 2, wherein said non-reacted portion of said refractory metal is removed after forming said conductive contact material in said contact opening together with an excess portion of said conductive contact material.

4. The method of claim 2, wherein said non-reacted portion of said refractory metal is removed prior to forming said conductive contact material in said contact opening.

5. The method of claim 2, wherein forming said conductive contact material comprises forming a tungsten-comprising material.

6. The method of claim 1, wherein forming a refractory metal layer comprises depositing at least one of cobalt, nickel and platinum.

7. The method of claim 1, wherein forming said semiconductor layer comprises depositing a silicon-containing layer by performing a chemical vapor deposition process at a temperature of 450° C. or less.

8. The method of claim 7, wherein performing said chemical vapor deposition process comprises establishing a deposition atmosphere by using chlorosilane and hydrogen.

9. The method of claim 1, wherein forming said contact opening comprises forming a trench in said dielectric material.

10. A method, comprising:
    forming a contact opening in a dielectric material of a semiconductor device, said contact opening exposing a portion of a doped semiconductor region;
    forming a silicon layer above said dielectric material and in said contact opening, a portion of said silicon layer contacting said exposed portion of said doped semiconductor region;
    performing an anisotropic etch process so as to remove said portion of said silicon layer and thereby re-expose said portion of said doped semiconductor region;
    forming a metal layer on said silicon layer and said re-exposed portion of said doped semiconductor region; and
    performing a heat treatment so as to initiate formation of a metal/silicon compound.

11. The method of claim 10, further comprising forming a contact material on said metal/silicon compound at least within said contact opening.

12. The method of claim 11, further comprising removing a non-reacted portion of said metal layer prior to forming said contact material in said contact opening.

13. The method of claim 11, further comprising removing a non-reacted portion of said metal layer after forming said contact material in said contact opening.

14. The method of claim 10, wherein forming said metal layer on said silicon layer comprises depositing at least one of cobalt, nickel and platinum.

15. The method of claim 10, wherein forming said silicon layer comprises performing a chemical vapor deposition process by using chlorosilane and hydrogen.

* * * * *